United States Patent [19]

La Chapelle, Jr. et al.

[11] Patent Number: 4,828,648

[45] Date of Patent: May 9, 1989

[54] LIQUID PHASE EPITAXY APPARATUS AND METHOD

[75] Inventors: Theodore J. La Chapelle, Jr.; Thomas P. Weismuller, both of Orange, Calif.

[73] Assignee: Rockwell International Corporation, El Segundo, Calif.

[21] Appl. No.: 157,557

[22] Filed: Feb. 19, 1988

Related U.S. Application Data

[62] Division of Ser. No. 867,974, May 29, 1986, Pat. No. 4,755,364.

[51] Int. Cl.$^4$ .......................................... H01L 21/208
[52] U.S. Cl. .................................... 156/605; 156/607; 156/609; 156/611; 156/612
[58] Field of Search ............... 156/605, 607, 609, 611, 156/612

[56] References Cited

U.S. PATENT DOCUMENTS

| | | | |
|---|---|---|---|
| 3,811,963 | 5/1974 | Hawrylo et al. | 156/605 |
| 4,357,620 | 11/1982 | Wang et al. | 357/16 |
| 4,366,771 | 1/1983 | Bowers et al. | 118/415 |
| 4,755,364 | 7/1988 | La Chapelle et al. | 156/605 |

OTHER PUBLICATIONS

Bardsley et al., "Crystal Growth", (1977) pp. 226–229.
Schneider et al., "Advances in Epitaxy and Endotaxy" (1976), pp. 236–245.
Growth, Properties and Applications of HgCdTe, J. L. Schmit Journal of Crystal Growth 65 (1983) 249–261.
Liquid Phase Growth of HgCdTe Epitaxial Layers, C. C. Wang et al., Journal of the Electromechanical Society, vol. 27, No. 1, Jun. 1980, 175–179.

Primary Examiner—Asok Pal
Attorney, Agent, or Firm—H. Fredrick Hamann; George A. Montanye; James F. Kirk

[57] ABSTRACT

An apparatus and method for performing liquid phase epitaxy, mercury containment, substrate leveling, in situ annealing/doping and gas flushing in a liquid phase epitaxy growth of HgCdTe. The apparatus is a self contained unit comprising a transparent cover for providing access to the interior of the apparatus and for forming a gas impermeable seal between the apparatus and the cover. The apparatus also contains a leveling apparatus, a gas flushing apparatus, and an apparatus for the in situ doping/quench annealing of HgCdTe epitaxial films. The leveling apparatus comprising channels and leveling balls that travel therein which align themselves between scribe marks when the apparatus is in a level position. The gas flushing apparatus is comprised of a gaseous purge ball valve that opens and seals a flushing channel that lead from the interior of the invention to the external environment. The in situ doping/quench annealing apparatus is accomplished via a stabilized chamber ball valve which operates independently with respect to the gaseous purge ball valve, thereby allowing in situ doping leveling without effecting the atmospheric integrity of the vessel.

3 Claims, 4 Drawing Sheets

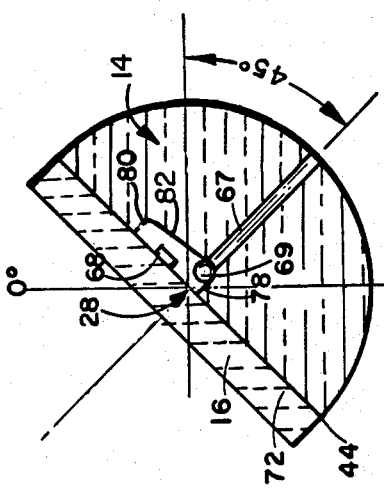
FIG. 6b TILTED LFT.
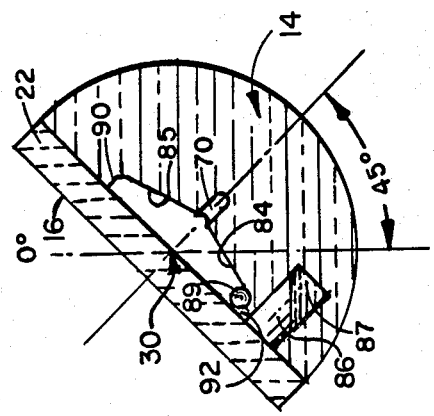
FIG. 7b TILTED LFT.
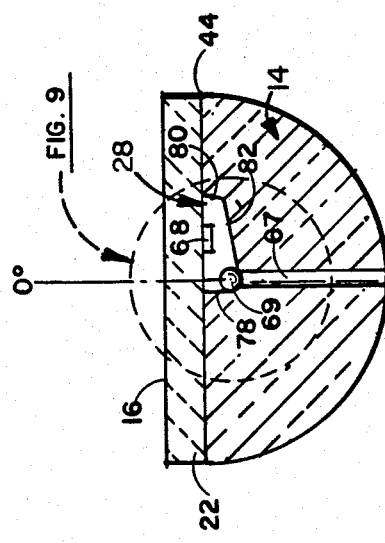
FIG. 6 LEVEL
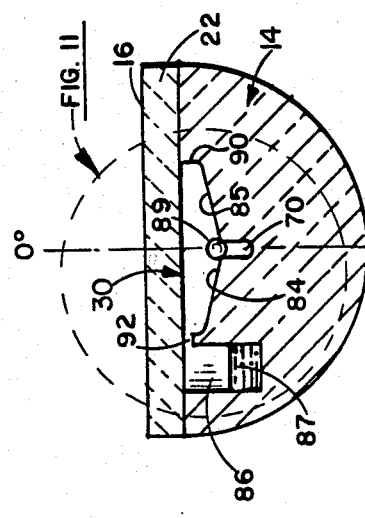
FIG. 7 LEVEL
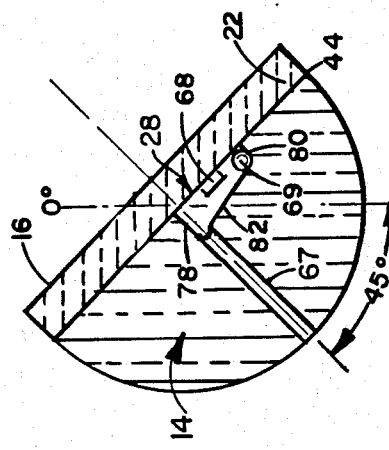
FIG. 6a TILTED RT.
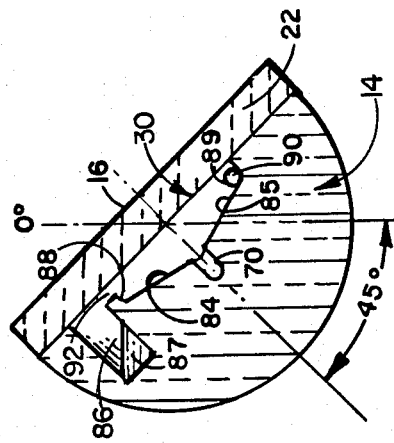
FIG. 7a TILTED RT

LIQUID PHASE EPITAXY APPARATUS AND METHOD

This application is a divisional of application Ser. No. 867,974 filed 5/29/1986, now U.S. Pat. No. 4,755,364.

BACKGROUND OF THE INVENTION

1. Field of the Invention

This invention relates to an apparatus and method for forming a layer of mercury cadmium telluride, and, more particularly, to such a method using an improved liquid phase epitaxy chamber.

2. Description of the Prior Art

Mercury cadmium telluride ($Hg_{1-x}Cd_xTe$) is typically used in the manufacture of infrared (IR) detectors, with commecial applications such as medical, thermography and building heat loss analysis. Detectors operating in the atmospheric windows are able to see both in the dark and through clouds. $Hg_{1-x}Cd_xTe$ is the material preferred for use in the 3-5 um and the 8-14 um wavelength IR detectors.

Methods of $Hg_{1-x}Cd_xTe$ crystal growth generally fall into three basic classes: growth from the melt, growth from solution, and growth from the vapor phase. All three of these methods and variations thereof have been, and are being used to grow $Hg_{1-x}Cd_xTe$, as described, for example, by J. L. Schmit, in the publication entitled "Growth, Properties and Applications of $Hg_{1-x}Cd_xTe$", in the Journal of Crystal Growth, Vol. 65, pages 249-261 (1983).

Liquid phase epitaxial (LPE) growth of $Hg_{1-x}Cd_xTe$ films utilizing epitaxial chambers, however, has become the most often chosen means by those requiring efficient and cost effective production of $Hg_{1-x}Cd_xTe$.

The epitaxial boat design directly effects the growth of the film. Several factors present control limitations in current production operations. One factor is the difficulty in determining whether or not the substrate surface is exactly horizontal during growth in the tiltable (horizontal) growth chamber. A second factor involves the seal between the boat cover and the boat. Still another factor relates to the efficiency, quality, and cost effectiveness of quench anneal and doping processes.

As mentioned above, maintaining the substrate surface exactly horizontal during the $Hg_{1-x}Cd_xTe$ crystallization/deposition onto the wafer substrate material is critical. For example, if the surface of the wafer is not exactly horizontal during growtn, the $Hg_{1-x}Cd_xTe$ melt will be deeper over one portion of the wafer than another. This difference in melt depth will effect both the thickness and composition of $Hg_{1-x}Cd_xTe$ crystallization on the wafer due to unequal depletions of mercury from both the surface of the melt, and from within the melt itself.

Heretofore, the usual check on proper horizontal positioning is by the operator's estimation of how uniformly the liquid melt is spread over the wafer surface after being positioned thereon—a purely qualitative estimate.

One prior method of determining the level of the boat required the introduction of a bubble level into the epitaxial chamber and properly leveling the epitaxial boat, the removal of the boat from the epitaxial furnace, the removal of the level and finally the repositioning of the boat. A typical liquid bubble level can be placed in the epitaxial boat while at room temperature to determine the level and adjustments made to effect exact horizontal positioning, but this bubble level must be removed and the boat repositioned exactly if this method is to work. Thus, a necessary sequential step is the removal of the bubble level without disturbing the boat, or removing the boat to remove the level and then properly re-positioning the boat in the exact original position. Once the boat is in the furnace, there is no way to positively determine whether or not the boat is still level. This practice is particularly limiting in as much as once the $Hg_{1-x}Cd_xTe$ growth begins there is no absolute way to check the boat level before the termination of the growth, i.e., by cooling down and re-introducing the bubble level into the boat. This practice inevitably leads to the contamination of the growth materials due to excess handling of the boat and introduction of foreign contaminants.

Other prior methods of leveling utilize a single ball during a preliminary room temperature determination. This technique is inaccurate because this type of level detector must also be removed before the actual growth run and is unable to simultaneously and accurately determine a level on both the horizontal axes since it rolls randomly on the flat surface of the growth chamber.

Modified LPE methods that have markedly increased the liquid melt depth over the wafer to alleviate the leveling problem increase the cost of the epitaxial process and also introduce convection problems. These convection problems inherently effect the quality and uniformity of the $Hg_{1-x}Cd_xTe$ crystal growth on the wafer.

A second above-mentioned factor directly affecting current LPE is the epitaxial boat sealing means. It has previously been a concern that despite the best efforts to seal a cover (normally constructed from quartz or similar inert material) over the epitaxial boat during the growth process, that mercury vapor would be lost from the chamber. Heretofore, the seal between the boat cover and the epitaxial boat has not been made impermeable by such gases. This was due to the necessity of the performance of an initial gas flushing step. This flushing procedure requires an efficient and complete replacement of the contained air which is normally introduced during the melt ingredient loading step. The requirements for this type of seal presented a dilemma, namely, to minimize mercury losses, the seal must be tight, but to permit good replacement of the atmosphere with an inert or reducing ambient, the seal must not be gas tight.

Heretofore, the sealing dilemma was attacked by costly epitaxial tuning runs. These runs were performed in an attempt to obtain the best possible seal tightness which allowed minimum escape of mercury and maximum atmosphere flushing capacity. These tuning runs, however, inevitably yielded non-uniform $Hg_{1-x}Cd_xTe$ film growths from LPE growtn to LPE growth. Despite the best efforts to control the torque on the LPE boat seals, mercury continued to be lost during the epitaxial growth. Furthermore, the quartz LPE boat covers were thin and subject to bowing during the thermal stresses of epitaxial growth, thereby, allowing additional and non-reproducible mercury loss during epitaxial growth.

The third factor mentioned above pertains to the efficiency, quality and cost effectiveness of the quench anneal/doping process during LPE. Heretofore, the current practice is to produce a $Hg_{1-x}Cd_xTe$ deposit on a cadmium telluride substrate (or on a cadmium telluride-coated alternate substrate, like sapphire) by liquid phase epitaxy. After a cool down of the epitaxy system, the sealed growth chamber is opened and the $Hg_{1-x}Cd_xTe$ deposited wafer is removed and optically and physically characterized. A small test part can be measured by the Hall effect to determine some of the electrical properties which are critical to the deposited wafers final use in device fabrication. Typical electrical carrier concentrations, measured using the Hall effect at 77 Kelvin, are usually in the range of $10^{16}$–$10^{17}$ cm$^{-3}$; however, a lower value in the $10^{15}$ range is more desirable for device material.

Accordingly, the lower value is achieved by an additional step in $Hg_{1-x}Cd_xTe$ processing; namely, by annealing. Depending on the desired properties, the anneal/doping procedure can vary. One typical technique uses mercury vapor in the 300°–400° C. temperature range. This step currently may be accomplished by sealing the wafer bearing the $Hg_{1-x}Cd_xTe$ film in a quartz capsule together with a small amount of mercury. Before seal off, the system must be pumped to a high vacuum to eliminate all gases other than mercury from the capsule. The sealed capsule is then inserted into a horizontal tube furnace and held at a predetermined anneal temperature, usually for a period of several hours, to allow mercury loss from the $Hg_{1-x}Cd_xTe$ during epitaxial cool down to be restored into the $Hg_{1-x}Cd_xTe$ film from the free mercury vapor. After the anneal, the capsule is quickly cooled so that the native defect concentration (see literature, for example: FIG. 20 on page 259 of J. L. Schmit's "Growth, Properties and Applications of $Hg_{1-x}Cd_xTe$", J. Cryst. Growth, Vol. 65, 249–261 (1983)) (this defect concentration usually being responsible for setting the measured carrier concentration value) now can be "frozen" into the material. Finally, the sealed quartz capsule must be broken open and the annealled wafer removed. These steps are, for a manufacturing operation, both time consuming and costly.

From the foregoing, it should be appreciated that present liquid phase epitaxy methods involving the deposition of $Hg_{1-x}Cd_xTe$ are extremely factor dependent. Moreover, the multitude of variables involved in the proceoss makes the technique more of an art than a science, thereby resulting in a variable or non-uniform deposition of $Hg_{1-x}Cd_xTe$ on wafer substrates.

Accordingly, a fuller understanding of the invention may be obtained by referring to the Summary of the Invention, and the Detailed Description of the Preferred Embodiment, in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a vessel for liquid phase epitaxy. The vessel comprises a longitudinal and lateral axis level detector, a gas flushing valve, an auxiliary stabilization reservoir, and a liquid phase epitaxy chamber. The lateral and longitudinal axis level detectors are preferably situated perpendicular to each other (in the same horizontal plane) and each singularly comprise a hollowed out slightly concaved shaped channel containing a ball which rolls along each respective channel and positions itself between scribe marks when the vessel is exactly level. The positioning of the leveling balls can be seen through a quartz cover or a cover constructed out of a similar inert material which is attached to the top of the vessel of the present invention.

The gas flushing valve assembly comprises an elongated trough shaped channel that is recessed within the top surface of the LPE apparatus. A passageway from this channel to the LPE chamber is opened and closed by the action of a sapphire ball valve or a ball valve made of another but similarly-inert material. The ball which rolls back and forth along the channel length opens and closes the passageway. When the passageway is open, the LPE chamber can be purged of air and filled with hydrogen during a series of vacuum pump-down and hydrogen refillings.

The auxiliary stabilization chamber comprises a container which has a ball valve control that can be independently operated with respect to the gas purge ball valve. This independent operation is actuated by an axial tilt of the LPE apparatus in the opposite mode to the operation of the latter. More specifically, both ball valves are so situated with respect to adjacent movement restraining walls that the tilt motion in one direction of one (the flush valve) does not unseat the other, but a tilt in the other direction can open both valves simultaneously. In a similar fashion to the gas flushing valve assembly a passageway leads from the LPE chamber to the auxiliary stabilization chamber container reservoir. This passageway is also opened and closed by the action of a sapphire ball valve or a ball valve made of another similarly-inert material. More particularly, the ball which rolls back and forth along the channel length, opens and closes this respective passageway. When this passageway is opened the quench anneal/doping process begins.

The liquid phase epitaxy chamber itself comprises a tub-shaped area in which the melt ingredients and wafer/substrate material are placed during the actual epitaxy process. Any number of melt containment devices and/or wafer supports can be utilized within this chamber. Upon the completion of the liquid phase epitaxial process and the quench anneal/doping process the vessel cover can be removed and the $Hg_{1-x}Cd_xTe$ end product can be removed from the liquid phase epitaxial chamber.

It is an object of this invention to provide an apparatus and method which overcomes the aforementioned inadequacies of the prior art devices and methods and provides an improvement which is a significant contribution to the advancement of liquid phase epitaxy.

Another object of this invention is to minimize the loss of mercury from the growth melt. That is, to maintain near zero but highly reproducible mercury losses after an initial gas flushing step.

Another object of this invention is to provide an improved level control to ensure an uniform thickness and composition of melt over the substrate.

Another object of this invention is to provide a method which produces a uniformity of thickness and uniformity of deposit of $Hg_{1-x}Cd_xTe$ on the substrate.

Another object of this invention is to provide an improved flush out of air and replacement of the growth environment with an inert or reducing gas ambient.

Another object of this invention is to provide a means whereby the level of the epitaxial chamber can be determined before, during, and after the commencement of $Hg_{1-x}Cd_xTe$ growth.

Yet another object of the invention is to provide an apparatus and method of level determination which is done external to the furnace, thereby reducing the possibilities of contamination.

Another object of this invention is to provide a method whereby the production of $Hg_{1-x}Cd_xTe$ is of a reproducible quantitative quality.

Still another object of this invention is to minimize possible exposure of operators to mercury by minimizing the loss of mercury from the growth chamber.

Another object of this invention is to provide an apparatus and method of in situ quench annealing/doping of the $Hg_{1-x}Cd_xTe$ which has been deposited on a substrate without the need of a second step which normally entails the reduction of the boat to room temperature and which requires a costly and elaborate technique involving high vacuum equipment, another high temperature furnace, and disposable sealed-off quartz capsules.

The foregoing summary of the invention outlines some of the more pertinent objects and features of the invention. The objects should be construed to be merely illustrative of some of the more prominent features and applications of the intended invention. Many other beneficial results can be obtained by applying the disclosed invention in a different manner or by modifying the invention within the scope of the disclosure. The summary outlines rather broadly the more pertinent and important features of the present invention in order that the detailed description of the invention that follows may be better understood so that the present contribution to the art can be more fully appreciated.

Additional features of the invention will be described hereinafter which will form the subject of the claims of the invention. It should be appreciated by those skilled in the art that the conception of the specific embodiments disclosed may be readily utilized as a basis for modifying or developing other methods for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Further objects and advantages of the present invention will become apparent as the following description of an illustrative embodiment proceeds, taken in conjunction with the accompanying drawings in which:

FIG. 6 is a cross-sectional view taken along line 6—6 of FIG. 2 illustrating the gaseous purge valve assembly.

FIG. 6a is a cross-sectional view of the operation of the gas purge valve when the apparatus is tilted to the right.

FIG. 6b is a cross-sectional view of the gas purge valve when the apparatus is tilted to the left.

FIG. 7 is a cross-section taken along line 7—7 of FIG. 3 illustrating the auxiliary stabilization reservoir.

FIG. 7a is a cross-sectional view illustrating the operation of the auxiliary stabilization reservoir when the apparatus is tilted to the right.

FIG. 7b is a cross-sectional view illustrating the operation of the auxiliary stabilization reservoir when the apparatus is tilted to the left.

Similar reference characters refer to similar parts throughout the several views of the drawings.

DRAWINGS REFERENCE NUMBERS

Figure 1:
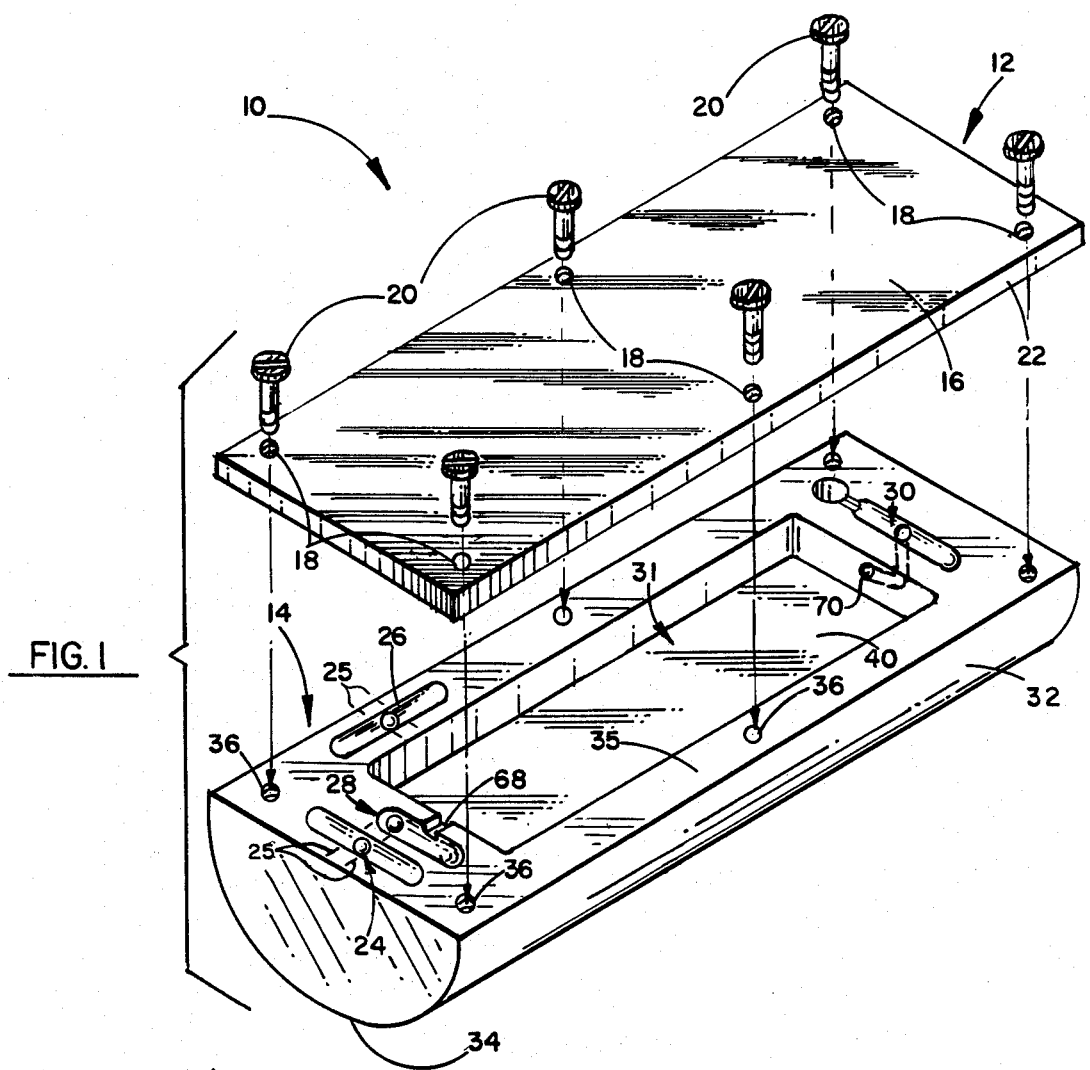
FIG. 1 is a perspective view of the liquid phase epitaxy apparatus illustrating the apparatus cover, epitaxy chamber, leveling channels, gas flushing valve and the auxiliary stabilization reservoir.

10 LPE apparatus
12 LPE cover assembly of LPE apparatus 10
14 LPE boat assembly
16 LPE quartz cover
18 screw holes in LPE quartz cover 16
20 cover screws
22 longitudinal side of LPE quartz cover 16
24 longitudinal axis level detector assembly
25 scribe marks
26 lateral axis level detector assembly
28 gas flushing valve assembly
30 auxiliary stabilization chamber assembly
31 LPE chamber
32 LPE boat sides
34 curved LPE boat bottom
35 LPE boat top surface
36 receiving holes for screws in LPE boat assembly 14
40 bottom surface of LPE chamber 31
44 gaseous tight seal interface between cover 16 and LPE boat top surface 35
46 lateral axis leveling ball of 26
48 longitudinal axis leveling ball of 24
50 circularly arced channel of 26
52 left restraining wall of 26
54 right restraining wall of 26
56 left restraining wall of 24
58 right restraining wall of 24
60 circularly arced channel of 24
62 side channel walls of 26
63 side channel walls of 24
64 point of contact between leveling ball and leveling channel
66 side channel walls of 28
67 gaseous purge channel
68 passageway to LPE chamber 31 of assembly 28
69 ball valve of 28
70 quench anneal/doping passageway of assembly 30 to LPE chamber 31
72 side channel walls of 30
74 illustrative lapped seats for valve assembly 28
78 left hand side retaining wall of 28
80 right hand side of retaining wall of 28
82 sloped channel towards 78 of 28
84 left sloped channel towards 70 of 30
85 right sloped channel towards 70 of 30

86 stabilization reservoir
87 reservoir contents
88 left hand side retaining wall of 30
89 ball valve of 30
90 right hand side retaining wall of 30
92 stabilization chamber vapor passageway of 30
93 illustrative lapped seats for valve assembly 30
94 stabilization chamber.

DESCRIPTION OF THE PREFERRED EMBODIMENT

FIG. 1 is a perspective view of the LPE apparatus 10 which comprises a cover assembly 12, and an LPE boat assembly 14. The LPE boat assembly 14 is preferably constructed from graphite or a similar material which is inert with respect to HgCdTe. The LPE boat assembly 14 is further comprised of a longitudinal axis level detector assembly 24, a lateral axis level detector assembly 26, a gas flushing valve assembly 28, an auxiliary stabilization chamber assembly 30, and the LPE chamber 31 itself.

The LPE cover assembly 12 further comprises a finely polished optically flat quartz cover 16. The thickness of cover 16 is preferably between ¼ inch and ¾ inches thick in order to withstand the various environmental factors during epitaxy such as: temperature expansions/contractions and pressures from within the chamber 31. This thickness is illustrated by reference numeral 22 in FIG. 1. Cover 16 is typically secured to the LPE boat assemoly 14 via a plurality of boat cover screws 20. These screws 20 are fitted through holes 18 in the cover 16 to engage in receiving holes 36 located in the surface 35 of the LPE boat assembly 14.

Without departing from the spirit and scope of this invention, it is noted that the preferred embodiment of the LPE cover assembly 12 illustrated in the drawings and described herein, is only one particular embodiment of a cover assembly 12 which may be utilized in conjunction with the LPE growth apparatus 10. Accordingly, many other means, such as lug nuts, Phillips-head screws, metallic or non-metallic straps, ano the like may be utilized in conjunction with the cover assembly 12 to secure it to the LPE boat assembly 14. Additionally, although quartz is the preferred material for the cover 16, any material with similar inert characteristics and adequate transparency (e.g. sapphire) is contemplated by this disclosure.

Figure 3:
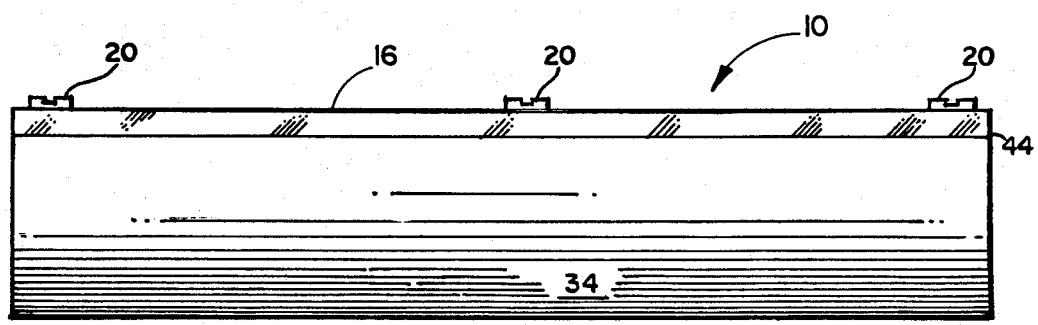
FIG. 3 is a side elevation view of a preferred embodiment of invention with the cover attached.

FIG. 3 illustrates a side elevation of the LPE apparatus 10 with the cover 16 attached thereto. By applying the proper amount of torque on the cover screws 20 a gas impermeable seal is created at the interface 44 between the optically-flat bottom of cover 16 and the LPE boat's 14 optically-flat top surface 35 (see FIG. 1). The LPE boat bottom 34 is preferably curved to increase the thermal mass of the boat 14 which fits closely inside a tube furnace. It is to be noted, however, that a myriad of bottom 34 and boat 14 shapes are contemplated by the instant disclosure. For example, the LPE boat assembly 14, as illustrated in FIG. 1, might be square shaped with a curved bottom, square shaped with a flat bottom or oval shaped with a curved bottom and still be in keeping with the spirit and scope of the invention.

Figure 2:
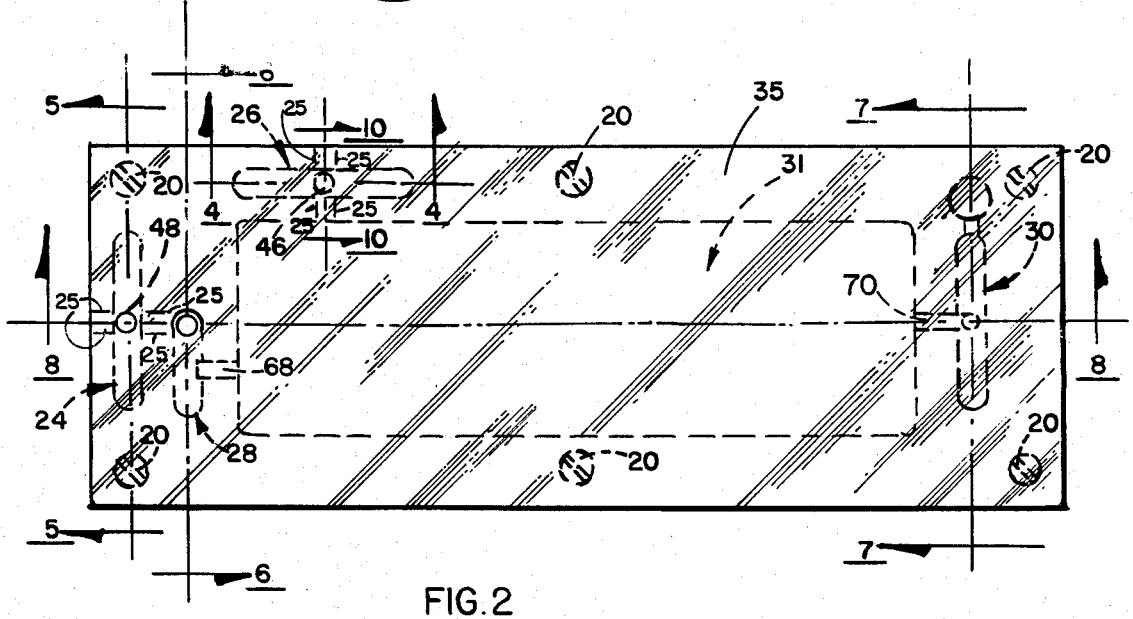
FIG. 2 is a top plan view of a preferred embodiment of the invention.

FIG. 2 is a top plan view of the LPE apparatus 10, taken looking down through cover 16. Scanning from left to right across FIG. 2 one can see the longitudinal axis level detector assembly 24, the gas flushing valve assembly 28, the lateral axis level detector assembly 26, the LPE chamber 31, and the auxiliary stabilization chamber assembly 30.

Figure 4:
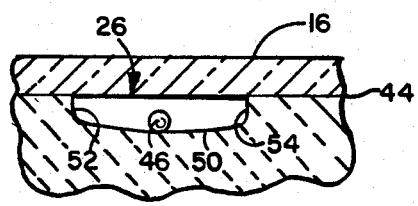
FIG. 4 is a cross-sectional view taken along line 4—4 of FIG. 2 showing the detail of the lateral axis level detector.

FIG. 4 is a cross-sectional view taken along line 4—4 of FIG. 2 showing the detail of the lateral axis level detector 26. More particularly, this assembly comprises a lateral axis leveling ball 46 which is normally constructed of sapphire or some similar inert material. Said ball 46 travels along a circularly arced channel 50 and is restrained by left and right retaining walls 52 and 54, respectively. The vertical motion of the leveling ball 46 is restrained by quartz cover 16. The diameter of the lateral axis leveling ball 46 is preferably small enough to allow free movement along the circularly arced channel 50 without becoming impinged between the cover 16 and the channel 50. An impinged leveling ball 46 will interfere with the operation of the lateral axis level detector assembly 26.

Figure 10:
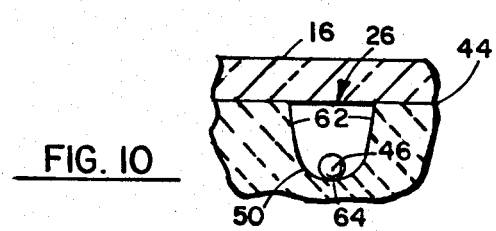
FIG. 10 is an enlarged cross-sectional view taken along line 10—10 of FIG. 2 illustrating the manner in which the leveling balls rest within the respective lateral and longitudinal axis leveling detectors.

FIG. 10 illustrates the side channel walls 62 of the lateral axis level detector assembly 26. As can be seen, the side channel walls 62 are preferably wider than the diameter of the wall to allow the free passage of ball 46 along the circularly arced channel 50. In the preferred embodiment, the contact between the leveling ball 46 and the circularly arced channel 50 is kept to a minimum to further enhance the rolling properties of ball 46. This point of contact is illustrated by reference numeral 64.

Figure 5:
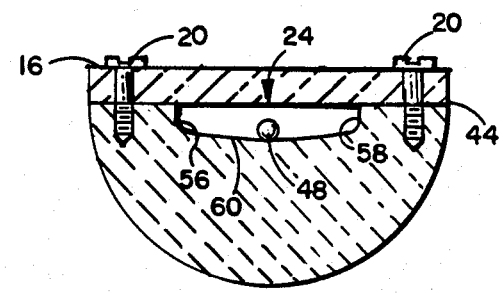
FIG. 5 is a cross-sectional view taken along the line 5—5 of FIG. 2 illustrating the detail of the longitudinal axis level detector.
Figure 8:
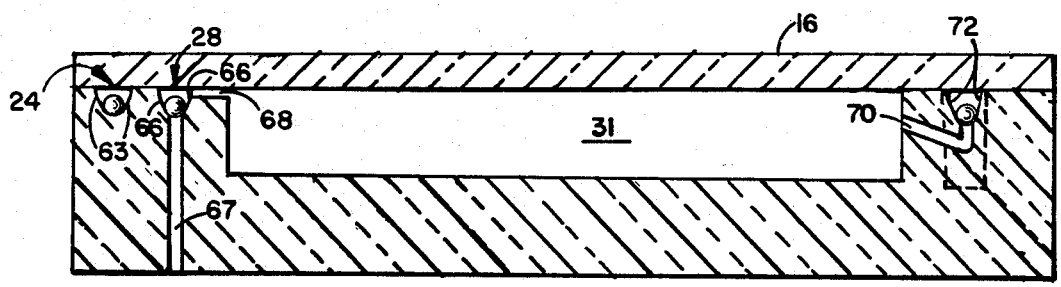
FIG. 8 is a cross-sectional view taken along line 8—8 of FIG. 2.

FIG. 5 is a cross-sectional view taken along line 5—5 of FIG. 2 illustrating the detail of the longitudinal axis level detector 24. The construction and operation of the longitudinal axis level detector assembly 24 is identical to that of the lateral axis level detector assembly 26 with one major exception, namely its orientation/location within the LPE boat assembly 14. Basically, the lateral axis level assembly 26 is situated perpendicular to the longitudinal axis level detector assembly 24. This orientation/location can be seen in FIG. 2. The longitudinal axis level detector assembly 24 comprises a longitudinal axis leveling ball 48 which travels along a circularly arced channel 60. The horizontal travel of the leveling ball 48 is limited by retaining walls 56 and 58 respectively. The vertical motion of the leveling ball 48 is restrained by the quartz cover 16. It is to be noted, that the diameter of the leveling ball 48 is preferably small enough to allow the free passage within and along channel 60 without a possibility of impingement against the quartz cover 16. Again, as with the lateral axis level detector assembly 26 an impinged leveling ball 48 will impair the operation of the lateral axis level detector assembly 26. FIG. 10, as described above, is also representative of the contact between ball 48 and the circularly arced leveling channel 60. FIG. 8, a cross-sectional view taken along line 8—8 of FIG. 2, further illustrates the side channel walls 63, 66, and 72 of the apparatus 10.

Turning now to FIG. 6, a cross-sectional view has been taken along line 6—6 of FIG. 2 illustrating the gaseous purge valve assembly 28. More specifically, a ball valve 69, seals off the gaseous purge channel 67 when the LPE boat 14 is resting in a horizontal (level) position as shown in FIG. 6. The gaseous purge channel 67 extends through the boat 14 to the external environment. This channel 67 can also be seen in FIG. 8. When boat 14 is tilted through an angle of not more than 45° but not less than 10° to the left as shown in FIG. 6b retaining wall 78 maintains the position of the ball valve 69 on the gaseous purge channel 67. However, when the boat 14 is tilted through an angle between 10° and 45° to the right as shown in FIG. 6a the ball valve 69 travels along a sloped channel 82 toward a right-hand retaining wall 80. The diameter of the ball valve 69 is preferably of a sufficient size to allow free passage along the angularly sloped channel 82, but not its passage through or into the gaseous purge channel 67 or through or into the passageway 68.

Figure 9:
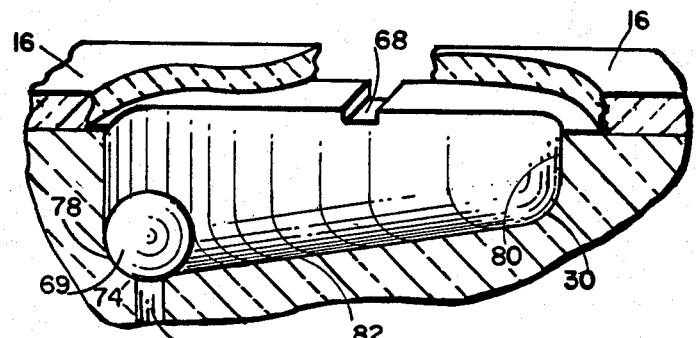
FIG. 9 is an enlarged perspective view of the area indicated in phantom lines on FIG. 6.

Referring to FIG. 9, an enlarged perspective view of the area indicated in phantom on FIG. 6 can be seen. More specifically, the manner in which the ball valve 69 is seated upon the gaseous purge channel 67 is illustrated. Ball valve 69 rests atop a ground-in lapped seat 74 that is along the sloped channel 82. The curvature of the ball valve 69 forms a 9aseous tight seal between the purge channel 67 and the LPE chamber 31. The right hand retaining wall 80 is preferably curved to enhance the rolling movement of ball valve 74 along the channel 82. The left hand retaining wall 78 is preferably curved to the same radius as ball valve 74 to enhance the seating of ball valve 74 upon the lapped seat 74 of the gaseous purge channel 67. It can also be seen from FIG. 9 that the diameter of ball 69 is preferably small enough that it travels below the passageway 68, thereby never occluding the passageway 68.

The auxiliary stabilization chamber assembly 30 is illustrated in FIG. 7. FIG. 7 is a cross-section taken along line 7—7 of FIG. 2. The stabilization chamber 30, comprises a stabilization reservoir 86 which is preferably twice as deep as its width to prevent spillage of its contents 87 during tilting. Sloped channels 84 and 85 are provided leading downward toward a quench anneal/doping passageway 70. The passageway 70 accordingly leads to the LPE chamber 31. This passageway 70 is preferably drilled at an angle as shown in FIG. 8 to facilitate manufacture of the apparatus 10. A ball valve 89 rests atop the opening of the passageway 70 when boat 14 is horizontal (level), thereby isolating the vapors in the stabilization reservoir 86 from the contents of the LPE chamber 31. Like ball 69 in FIG. 9, ball 89 is lappeo into its seat at the top edge of passageway 70.

When boat 14 is tilted to an angle of not more than 45° but not less than 10° to the left as shown in FIG. 7b, the ball valve 89 travels along the left sloped channel 84 and comes to rest againstthe left hand side retaining wall 88. When ball valve 89 is in this position, the quench anneal/doping passageway 70 is open to the LPE chamber 31, and the vapor passageway 92 conducts the gases in stabilization reservoir 86 to the LPE chamber 31 via the quench anneal/doping passageway 70. Conversely, when the boat 14 is tilted through an angle between 10° and 45° to the right as shown in FIG. 7a, the ball valve 89 opens and travels along a sloped channel 85 toward a right hand retaining wall 90. In the preferred embodiment, retaining wall 90 is slightly circular in shape to reduce the likelihood of ball valve 89's impingement between the cover 16 and sloped channel 85. Accordingly, to this end, the diameter of ball valve 89 is preferably of a sufficient size to allow free passage along the angularly sloped channels 85 and 84, respectively, without allowing its passage through or into the quench anneal/doping passageway 70 or the stabilization chamber vapor passageway 92.

Figure 11:
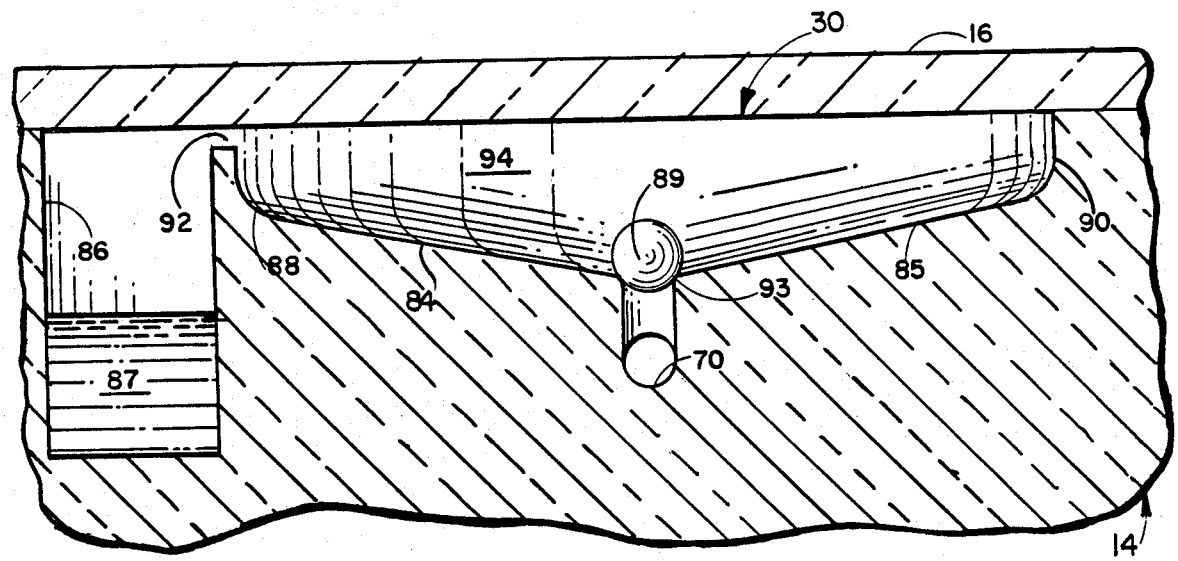
FIG. 11 is an enlarged cross-sectional view of the area indicated in phantom lines on FIG. 7.

Referring now to FIG. 11, an enlarged cross-sectional view of the area indicated in phantom lines on FIG. 7 can be seen. More particularly, the manner in which the ball valve 89 seats upon the quench anneal/doping of passageway 70 is illustrated. Additionally, the stabilization reservoir 86, its contents 87, the stabilization chamber 94, the vapor passageway 92 between 86 and 94, the curved area of the right hand retaining wall 90, and the curved portion of the left hand side retaining wall 88 are also shown in detail. Ball valve 89 is shown resting atop a ground-in lap seat 93 that is along the sloped channels 84 and 85, respectively. The curvature of ball valve 89 forms a gaseous tight seal between the quench anneal/doping passageway 70 and the stabilization chamber 94.

THE METHOD

The method of operation of the invention is integrally related to the apparatus 10 of the invention. The first step taken is to load the LPE chamber 31 with the appropriate epitaxial melt ingredients and substrate material. It is to be noted at this juncture that the LPE cover 12 is removed for purposes of the loading.

The next step taken if quench/anneal is desired or necessary, is the loading of the stabilization reservoir 86 of the auxiliary stabilization chamber assembly 30, as shown in FIG. 11, with the desired annealant or dopant. Care must be exercised at this step to ensure that the level of the reservoir contents 87 is maintained sufficiently low enough to prevent the reservoir contents 87 from overflowing through the stabilization chamber vapor passageway 92 during tilting operations. This level is preferably less than 1/3 the height of the stabilization reservoir 86. Once the loading operations are complete, cover 16 is affixed to the LPE boat top surface 35 with six graphite screws 20 as shown in FIG. 1. More specifically, the six graphite screws 20 are fed through screw holes 18 and subsequently mated to the receiving holes 36. The cover screws 20 are then tightened preferably in an alternating fashion using a properly adjusted torque wrench to ensure a hermetically (gaseous impermeably) tight seal as shown in FIG. 3 at 44. Once boat 14 has been loaded and hermetically sealed, it is placed upon a boat holder within a LPE furnace. For purposes of clarification, the LPE boat 14 is firmly secured to a boat holder and placed into a LPE furnace. Briefly, an LPE furnace is usually a multi-zoned tube-type furnace in which an epitaxial vessel/load is placed for epitaxy. The LPE furnace can be pressurized, purged, heated, cooled and tilted in a myriad of directions. The use of boat holders and LPE furnaces is well known in the art; See for example:

C. C. Wang, et al. "Liquid Phase Growth of HgCdTe Epitaxial Layers", *Journal of the Electro-Chemical Society*, Vol. 127, No. 1, January 1980;

J. L. Schmit's "Growth, Properties and Applications of $Hg_{1-x}Cd_xTe$", *J. Cryst. Growth*, Vol. 65, 249–261 (1983).

Referring again to FIG. 11, it is to be noted that care must be taken during the handling/loading of the boat 14 so that it is not tilted or tipped more than 45° in any one direction. Tipping in excess of 45° may cause the stabilization reservoir contents 87 to spill over via passageway 92. That occurrence would interfere with the operation of ball valve 89, which in turn might contaminate the contacts of LPE chamber 31.

The next logical step calls for the removal of the atmosphere within the LPE apparatus 10 and the replacement of it with a suitable inert gas, such as hydrogen or nitrogen. Generally, this entails the vacuum purging of the gas flushing valve assembly 28, the auxiliary stabilization chamber 30, and the LPE chamber 31 itself.

More specifically, as shown in FIG. 6A this is accomplished by firstly tilting the boat 14 to the right to an angle of not more than 45° but not less than 10°. This tilting in turn dislodges the ball valve 69 from its lapped seats 74 (see FIG. 9) allowing the forces of gravity to act upon ball valve 69, causing the ball valve 69 to roll along sloped channel 82 toward the retaining wall 80. It is in this position that the ball valve 69 remains until further tilting of the boat 14 occurs.

Referring now to FIG. 7a, it can be seen that the tilting of boat 14 to the right between 10° and 45° simultaneously affects the positioning of the ball valve 89 of the auxiliary stabilization chamber 30. More particularly, when the boat 14 is tilted from its horizontal position as shown in FIG. 7, the ball valve 89, drawn by the forces of gravity leaves lapped seat 93 (as shown in FIG. 11) and rolls along the right sloped channel 85 toward the right hand side retaining wall 90. It is in this position that the ball valve 89 remains until further tilting of boat 14 occurs.

In FIG. 6a, the gaseous purge channel 67 now is open to the external environment. Similarly, the quench anneal/doping passageway to the LPE chamber 31 is also open to the outside environment. A vacuum is introduced into the furnace system which surrounds the boat 14, thus allowing the air within the LPE apparatus 10 to be pumped out utilizing standard vacuum pumps as are well known in the art. Once the unwanted air has been pumped out, an inert gas is introduced which flows into the LPE apparatus 10 via the gaseous purge channel 67 and through passageway 68 to the LPE chamber 31. The inert gas then flows from the LPE chamber 31 through the quench anneal/doping passageway 70, past the stabilization chamber vapor passageway 92 into the stabilization reservoir 86. This vacuuming/flushing procedure is repeated several times, preferably five to ten times, to ensure the complete flushing of air from the LPE apparatus 10 as well as the complete replacement thereof with inert gas.

Once this gaseous purge/flushing procedure is complete, the LPE apparatus 10 is tilted once again to a level position as shown in FIGS. 6 and 7. In this position, ball valves 69 and 89 travel down sloped channels 82 and 85, respectively. The ball valves 69 and 89 then seat themselves upon lapped surfaces 74 (see FIG. 9) and 93 (see FIG. 11), respectively. At this point, the LPE chamber 31 is hermetically sealed from the external environment, or in this case, the LPE furnace and the contents of the LPE chamber 31 are hermetically isolated from the stabilization chamber 30 and associated reservoir contents 87.

The boat 14 is now adjusted in the furnace to be in a perfectly level position by use of the level detectors 24 and 26, as can be seen in FIGS. 1, 2, 3, 4 and 5. More specifically, the boat 14 is maneuvered into a level position as indicated by the simultaneous positioning of leveling balls 46 and 48 between the scribe marks 25.

The epitaxial growth process is now initiated. This process typically includes the elevation of temperatures within the LPE furnace to the proper growth value and then the melt ingredients are moved to a position over the wafer/substrate. The LPE growth phase proceeds for a given period of time depending on the results desired, for example see J. L. Schmit, in the publication entitled "Growth, Properties and Applications of $Hg_{1-x}Cd_xTe$", in the Journal of Crystal Growth, Vol. 65, pages 249–261 (1983). Upon the termination of the LPE growth the melt is removed from the wafer and the LPE furnace is cooled down.

During this cooling down operation it is possible to introduce the reservoir contents 87 into the LPE chamber 31 if so desired by the following steps: first, the LPE apparatus 10 is tilted to the left on its longitudinal axis through an angle between 10° and 45° (dependent upon the ratio of ball valve 69 diameter to lapped seats 74) as depicted in FIGS. 6b amd 7b. In this position ball valve 89 is displaced from its seated position on the quench/anneal doping passageway 70 to the LPE chamber 31. The hermetic seal to the external furnace environment is maintained through this tilt by ball valve 69 which remains seated atop the lapped seats 74 as shown in FIG. 9. The stabilization reservoir contents 87, may now escape as vapors from the reservoir 86 and travel into the LPE chamber 31 via the vapor passageway 92 and the quench/anneal doping passageway 70. It is to be noted that the above steps for introducing annealant material can be performed during the LPE growth phase if desired. If this is the case, the procedure is now called doping.

After the LPE apparatus 10 is cooled down, the apparatus 10 is recovered from the furnace, the cover 16 is removed and the LPE deposited wafer is extracted. The residual materials that remain within the apparatus 10 can then be removed prior to the next epitaxial run.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the method steps, details of construction and the combination and arrangement of parts may be resorted to without departing from the spirit and scope of the invention.

Now that the invention has been described, what is claimed is:

1. A method comprising the steps of:
    (a) loading epitaxial melt ingredients and substrate into a pressure and temperature controlled vessel having a stabilization reservoir;
    (b) loading annealing/dopant materials into said stabilization reservoir;
    (c) removing and replacing atmosphere contained within said vessel with an inert gas by:
        (1) tilting said vessel in a first direction through an angle of 45° but not less than 10°;
        (2) introducing a vacuum into the vessel during said tilting thereby evacuating the atmosphere therein;
        (3) pumping desired insert gas into said vessel while tilted;
    (d) tilting said vessel back to a level position in order to seal off said melt ingredients and said substrate of said vesel from outside of said vessel;
    (e) increasing the temperature of said vessel to proper epitaxial growth values and in situ introducing dopant materials during this step;
    (f) effecting contact between said melt ingredients and the substrate; and
    (g) reducing the temperature of said melt ingredient, to cause the dissolved components in the solution to crystallize in an epitaxial layer on the substrate and in situ introducing annealant during this step.

2. A method comprising the steps of:
    (a) loading epitaxial melt ingredients and substrate into a pressure and temperature controlled vessel having a stabilization reservoir;

(b) loading annealant/dopant materials into said stabilization reservoir;
(c) removing and replacing atmosphere contained within said vessel with an inert gas;
(d) adjusting said vessel to a perfectly level position;
(e) increasing the temperature of said vessel to proper epitaxial growth values and in situ introducing dopant material during this step by:
  (1) tilting said vessel in a second direction on through an angle of not more than 45° but not less than 10°, to cause the dopant contents of said stabilization reservoir to make contract with said epitaxial melt ingredients and said substrate;
  (2) tilting of said vessel back to a level position to seal off the contents of said stabilization reservoir from said epitaxial melt ingredients and said substrate;
(f) effecting contact between said melt ingredients and the substrate; and
(g) reducing the temperature of said melt ingredient, to cause the components in the solution to crystallize in an epitaxial layer on the substrate and in situ introducing annealant during this step.
3. A method comprising the steps of:
(a) loading epitaxial melt ingredients and substrate into a pressure and temperature controlled vessel having a stabilization reservoir;
(b) loading annealant/dopant materials into said stabilization reservoir;
(c) removing and replacing atmosphere contained within said vessel with an inert gas;
(d) adjusting said vessel to a perfectly level position;
(e) increasing the temperature of said vessel to proper epitaxial growth values and in situ introducing dopant materials during this step;
(f) effecting contact between said melt ingredients and the substrate; and
(g) reducing the temperature of said melt ingredient, to cause the dissolved components in the solution to crystallize in an expitaxial layer on the substrate and in situ introducing annealant during this step by:
  (1) tilting the vessel to the left through an angle of not more than 45% but not less than 10° to cause said annealant materials of said stabilization reservoir to make contact with said epitaxial melt ingredients and said substrate; and
  (2) tilting said vessel back to a level position in order to seal off the contents of said stabilization reservoir from said epitaxial melt ingredients and substrate.

* * * * *